US005473195A

United States Patent [19]
Koike

[11] Patent Number: 5,473,195
[45] Date of Patent: Dec. 5, 1995

[54] SEMICONDUCTOR INTEGRATED CIRCUIT DEVICE HAVING PARALLEL SIGNAL WIRINGS VARIABLE IN EITHER WIDTH OR INTERVAL

[75] Inventor: Hiroki Koike, Tokyo, Japan

[73] Assignee: NEC Corporation, Tokyo, Japan

[21] Appl. No.: 227,029

[22] Filed: Apr. 13, 1994

[30] Foreign Application Priority Data

Apr. 13, 1993 [JP] Japan ..................... 5-085823

[51] Int. Cl.⁶ ................ H01L 23/48; H01L 29/44; H01L 29/52
[52] U.S. Cl. ............... 257/775; 257/773; 257/203; 257/208; 257/210
[58] Field of Search ............... 257/773, 775, 257/203, 208, 210

[56] References Cited

U.S. PATENT DOCUMENTS 4,914,504  4/1990  Rosan ..................... 257/773

FOREIGN PATENT DOCUMENTS 0303049    2/1989   European Pat. Off. .
60-254633  12/1985  Japan ..................... 257/773
61-156834  7/1986   Japan ..................... 257/773
1-239964   9/1989   Japan .
3-120743   5/1991   Japan .

OTHER PUBLICATIONS

Patent Abstracts of Japan, vol. 13, No. 333 (E-794), Jul. 26, 1989.

Primary Examiner—Jerome Jackson
Assistant Examiner—John F. Guay
Attorney, Agent, or Firm—Sughrue, Mion, Zinn, Macpeak & Seas

[57] ABSTRACT

Signal wirings are incorporated in a semiconductor integrated circuit device for propagating a multi-bit signal from an array of pads to input buffer circuits, and either wiring gap or wiring width is changed for canceling difference in time constant due to the different wiring lengths so that the component bits of the multi-bit signal concurrently arrive at the input buffer circuits.

6 Claims, 9 Drawing Sheets

С,473,195

SEMICONDUCTOR INTEGRATED CIRCUIT DEVICE HAVING PARALLEL SIGNAL WIRINGS VARIABLE IN EITHER WIDTH OR INTERVAL

FIELD OF THE INVENTION

This invention relates to a semiconductor integrated circuit device and, more particularly, to signal wirings incorporated in the semiconductor integrated circuit device.

DESCRIPTION OF THE RELATED ART

A typical example of the signal wirings incorporated in a semiconductor integrated circuit device is illustrated in FIG. 1 of the drawings. The prior art semiconductor integrated circuit device is a memory device, and is fabricated on a single semiconductor chip 1. The semiconductor chip 1 has an peripheral area 2 assigned to an array of signal input pads P0, P1, P2, P3, P4 and P5, and a multi-bit address signal A0, A1, A2, A3, A4 and A5 is supplied from the outside to the signal input pads P0 to P5.

The semiconductor chip 1 further has an internal area assigned to address buffer circuits IN0, IN1, IN2, IN3, IN4 and IN5, and signal wirings WR0, WR1, WR2, WR3, WR4 and WR5 are patterned between the array of signal input pads P0 to P5 and the address input buffer circuits IN0 to IN5. A wiring area 4 is assigned to the signal wirings WR0 to WR5. Though not shown in FIG. 1, the address buffer circuits IN0 to IN5 temporally store the multi-bit address signals A0 to A5, and distribute a multi-bit internal address signal to a row address decoder and a column address decoder for selecting accessed memory cells.

The signal input pads P0 to P5 are arranged in the peripheral area 2 at intervals, and the interval is determined by the interval of signal input pins (not shown). In this instance, the interval of the two adjacent signal input pads is about 1 millimeter.

In this instance, the wiring area 4 is contiguous to the peripheral area 2, and the internal area 3 is located on the right side of the wiring area 4. The signal wirings WR0 to WR5 are three times bent at right angles, and are equal in width and interval to one another. In this instance, the width W is 1.6 microns, and the interval is also 1.6 microns.

The address buffer circuits IN0 to IN5 are laterally spaced apart from the signal input pad P5 by 5 millimeters, and the distance between the lateral path of the signal wiring WR0 and the address buffer circuit IN5 is about 1 millimeter. As a result, the total signal path of the signal wiring WR0 is more than 10 millimeters, and the total path of the signal wiring WR5 is six-odd millimeters. Thus, the signal wirings WR0 to WR5 provide the signal paths different in length to one another to the address bits A0 to A5, and parasitic capacitances coupled therewith are, accordingly, different from one another.

When the address bits A0 to A5 at the pads P0 to P5 are changed from a high voltage level to a low voltage level, the voltage levels at the input nodes B0 to B5 of the buffer circuits IN0 to IN5 respectively trace Plots PB0 to PB5 as shown in FIG. 2, and a time delay is introduced between the propagation of the address bit A0 and the propagation of the address bit A5.

Although the parasitic capacitance per unit length is variable with the structure of the semiconductor integrated circuit device, the parasitic capacitance per unit length is inversely changed in terms of the wiring interval, and the parasitic capacitance of a wide wiring is larger than that of a narrow wiring as shown in FIG. 3. If the wiring interval is decreased, a parasitic capacitance with the adjacent signal wirings is increased in so far as the wiring interval is constant, and affects the total parasitic capacitance. On the other hand, the wider signal wiring increases a parasitic capacitance with the insulator therebeneath, and the parasitic capacitance at the bottom surface affects the total parasitic capacitance.

When the total parasitic capacitance is multiplied by a resistance of the wiring, the product is known as time constant, and the time contact of the signal wiring is plotted in terms of the wiring interval in FIG. 4. Real lines are indicative of the wiring interval dependency of the time constant for the signal wiring contact in width at 1.2 microns and variable in length L from 5 millimeters to 10 millimeters, and broken lines represents the wiring interval dependency of the time constant for the signal wiring constant in width at 1.6 microns and variable in length L between 5 millimeters and 10 millimeters. The tendencies indicated by Plots in FIG. 3 are also observed in the real and broken lines in FIG. 4, and the time constant becomes larger together with the wiring length.

From the discussion above, it is understood that the signal wiring WR0 introduces much time delay into propagation of the address bit A0 rather than the signal wiring WR5 for the address bit A5 due to the long signal propagation path under the same wiring interval and the same wiring width. In the semiconductor memory device, an address decoder should wait for the arrival of the address bit A0 at the input node B0 of the address buffer circuit IN0, and the time delay of the address bit A0 is one of the technical barriers against a high-speed access.

If the wiring width is increased, the access speed is increased. However, the wide wirings occupy a large amount of real estate, and decreases the integration density of the semiconductor integrated circuit device.

SUMMARY OF THE INVENTION

It is therefore an important object of the present invention to provide a semiconductor integrated circuit device a wiring arrangement of which accelerates a sequential signal propagation in the semiconductor integrated circuit device without sacrifice of occupation area assigned to the wiring arrangement.

To accomplish the object, the present invention proposes to change a wiring interval or a wiring width inversely proportional to wiring lengths.

In accordance with the present invention, there is provided a semiconductor integrated circuit device fabricated on a single semiconductor chip, comprising: a) a source of a multi-bit signal assigned a first area of the single semiconductor chip; b) a destination of the multi-bit signal assigned to a second area of the single semiconductor chip; and c) a plurality of signal wirings providing respective propagation paths between the source and the destination for component bits of the multi-bit signal, at least one propagation path being different in length from the other propagation paths, the at least one propagation path being different in at least one of a gap to the adjacent signal wiring and a wiring width from another of the propagation paths so as to decrease a difference of a time constant due to the difference in length of the propagation paths.

BRIEF DESCRIPTION OF THE DRAWINGS

The feature and advantages of the semiconductor integrated circuit device according to the present invention will be more clearly understood from the following description taken in conjunction with the accompanying drawings in which.

DESCRIPTION OF THE PREFERRED EMBODIMENTS

First Embodiment

Figure 5:
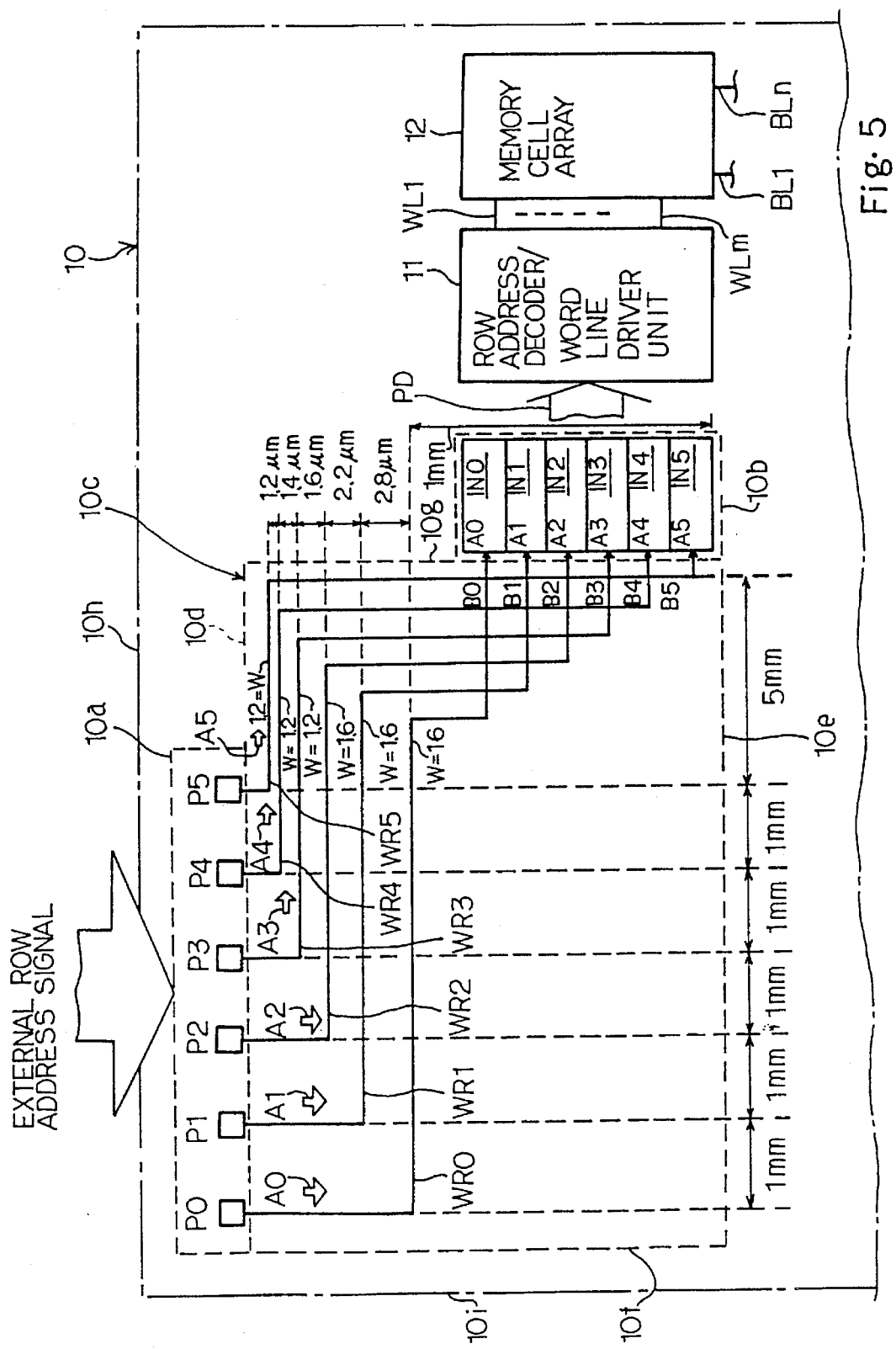
FIG. 5 is a schematic plan view showing the layout of a semiconductor integrated circuit device according to the present invention.

Referring to FIG. 5 of the drawings, a semiconductor memory device embodying the present invention is fabricated on a single semiconductor chip 10, and comprises an array of input signal pads P0/P1/P2/P3/P4/P5 respectively connected with address pins (not shown) for receiving a multi-bit external row address signal A0/A1/A2/A3/A4/A5, an array of address buffer circuits IN0/IN1/IN2/IN3/IN4/IN5 for producing row address predecoded signals PD, a row address decoder/word line driver unit 11 for selectively energizing word lines WL1 to WLm and a memory cell array 12 implemented by a plurality of memory cells arranged in rows and columns. The word lines WL1 to WLm are respectively coupled with the rows of memory cells, and an energized word line allows the associated row of memory cells to produce potential differences indicative of data bits stored therein on bit line pairs BL1 to BLn.

Although the memory cell array 12 are further accompanied with a column address decoder, an input/output circuit etc, they are omitted from FIG. 5 for the sake of simplicity.

The semiconductor chip 10 has a peripheral area 10a assigned to the array of input signal pads P0/P1/P2/P3/P4/P5, an internal area 10b assigned to the array of address buffer circuits IN0/IN1/IN2/IN3/IN4/IN5 and an internal area 10c assigned to signal wirings WR0/WR1/WR2/WR3/WR4/WR5 connected between the array of input signal pads P0 to P5 and the address buffer circuits IN0 to IN5, and the address bits A0/A1/A2/A3/A4/A5 of the external row address signal are respectively propagated through the signal wirings WR0/WR1/WR2/WR3/WR4/WR5 to the address buffer circuits IN0/IN1/IN2/IN3/IN4/IN5. In this instance, the internal area 10c is generally rectangular, and, accordingly, has two lateral edges 10d and 10e and two side edges 10f and 10g. The peripheral area 10a is contiguous to the lateral edge 10d and closer to one 10h of the lateral edges of the semiconductor chips 10. On the other hand, the internal area 10b is contiguous to the side edge 10g and farther from one 10i of the side edges of the semiconductor chip 10. For this reason, the signal wirings WR0 to WR5 are three times bent at right angles, and important distances are written in FIG. 5.

Figure 1:
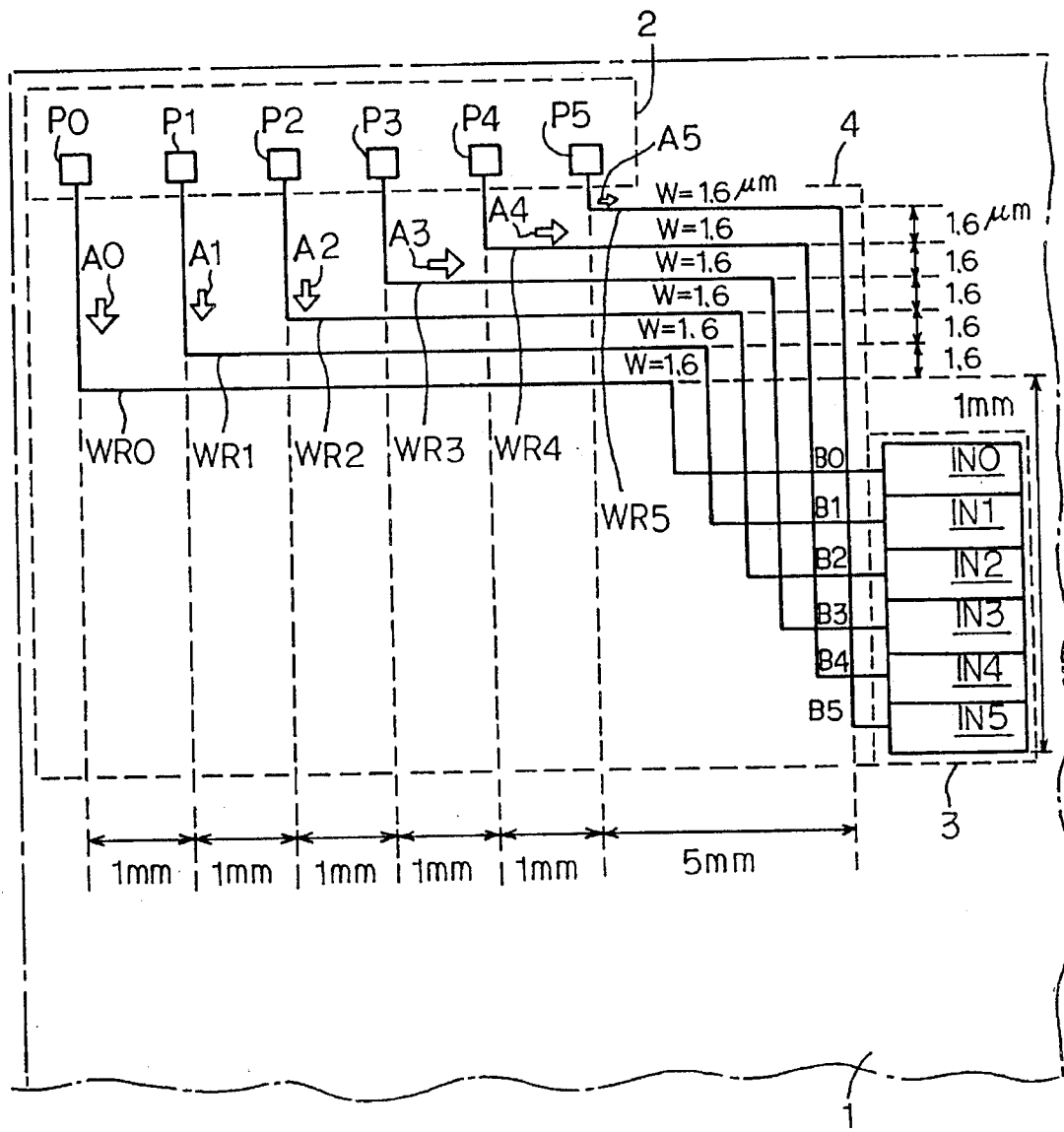
FIG. 1 is a schematic plan view showing the layout of the signal wirings incorporated in the semiconductor integrated circuit device.
Figure 2:
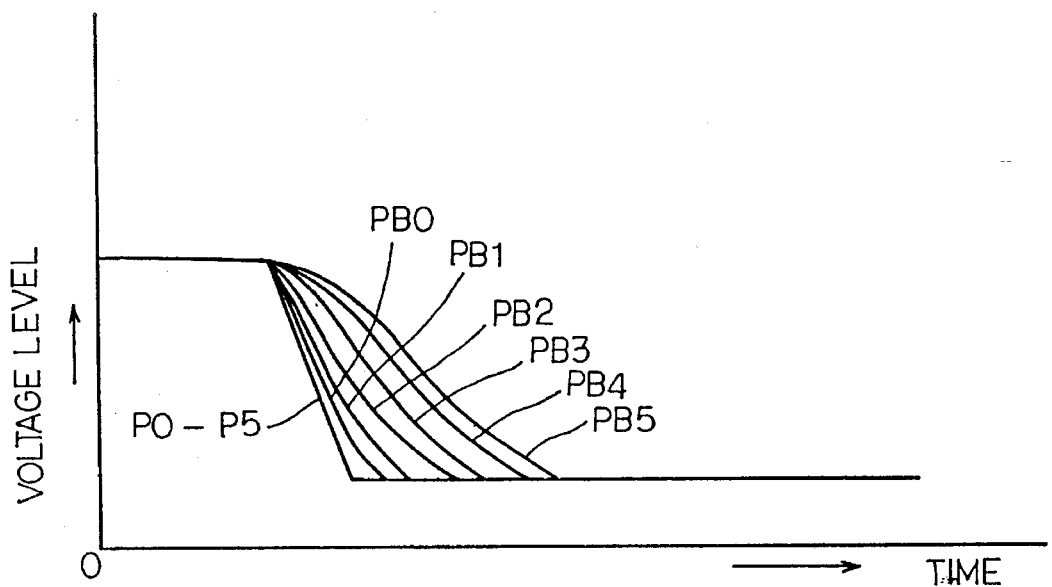
FIG. 2 is a graph showing time delays introduced into the propagation of the signals on the prior art wiring arrangement.
Figure 3:
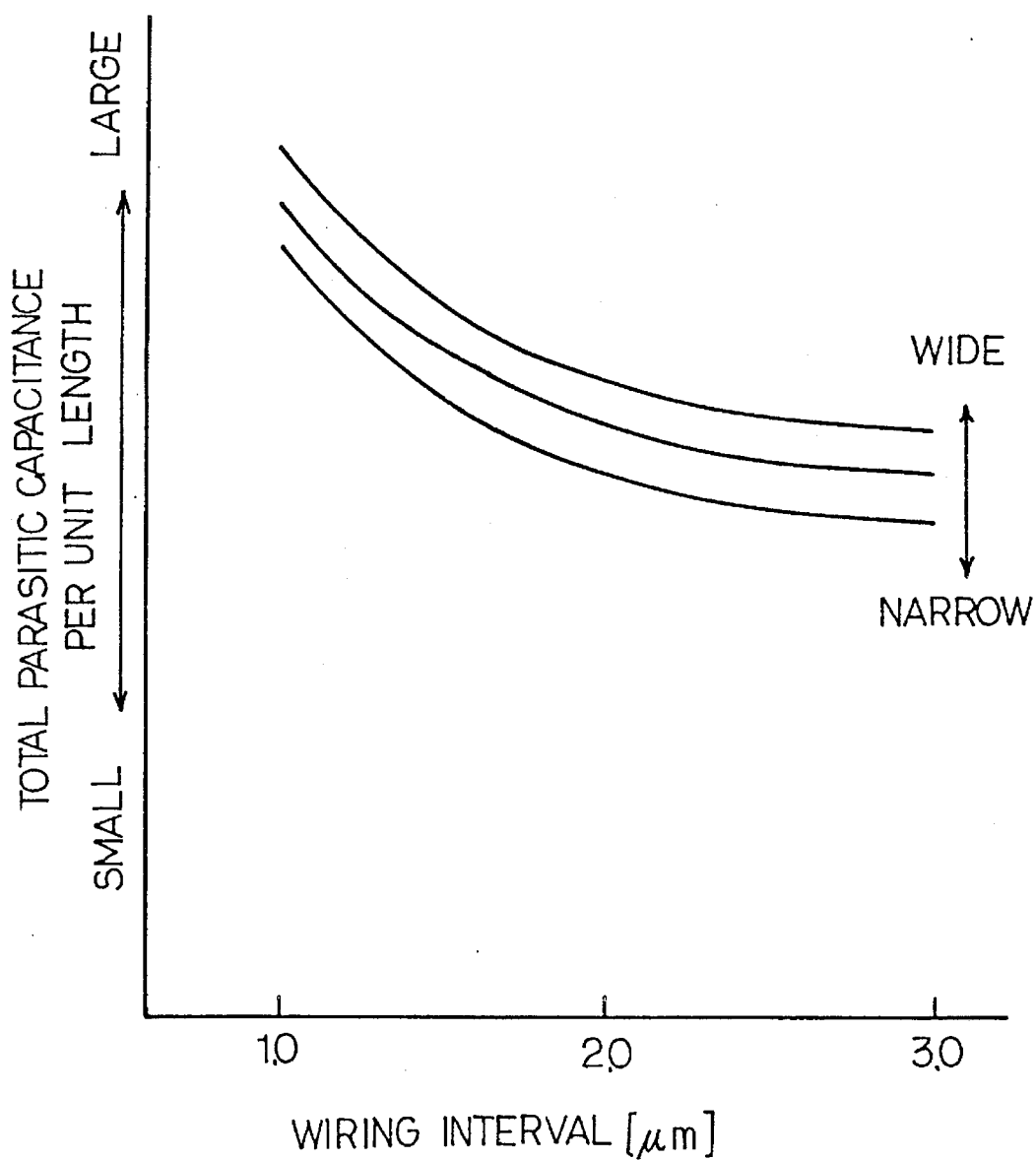
FIG. 3 is a graph showing the parasitic capacitance per unit length in terms of the wiring interval and the wiring width.
Figure 4:
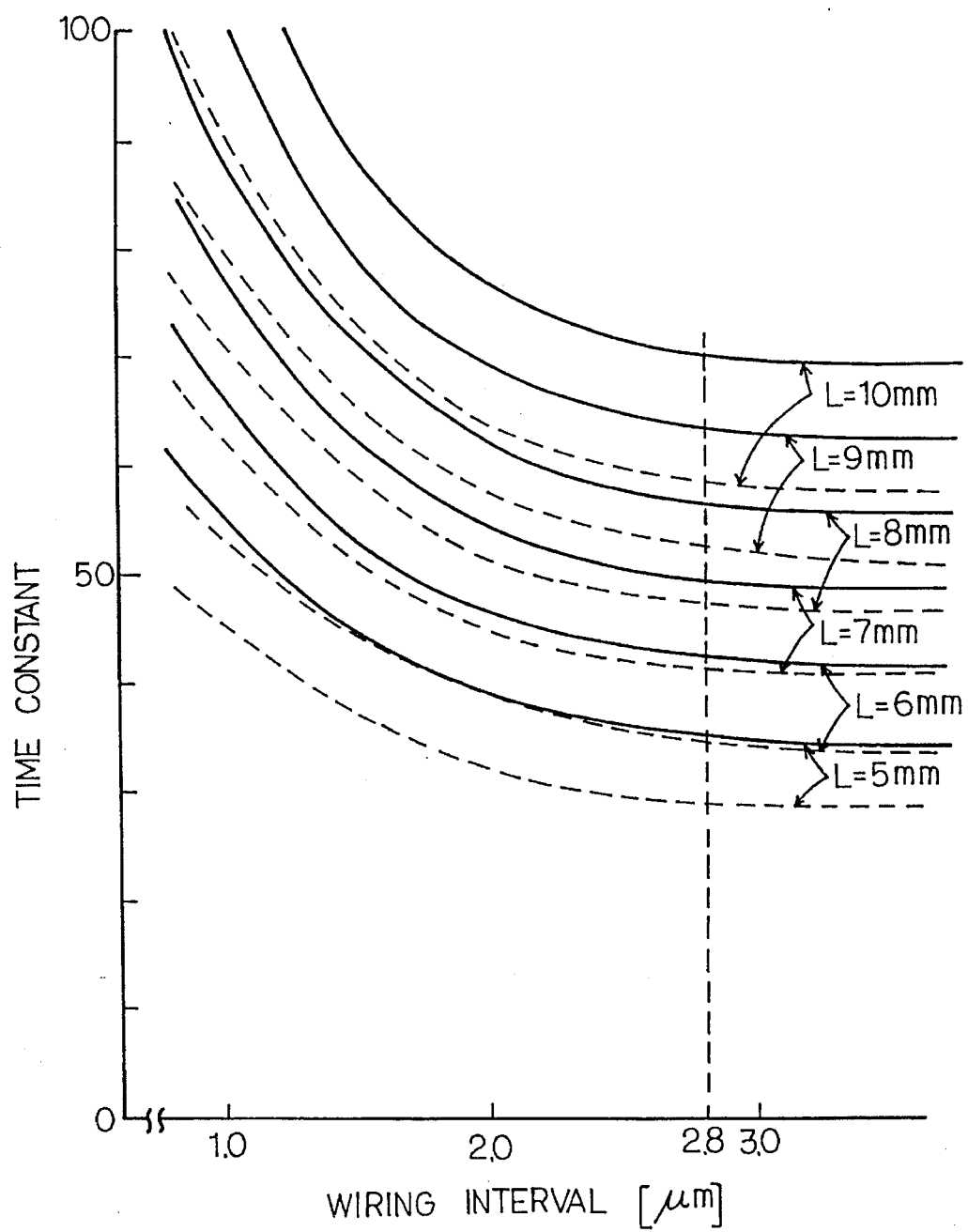
FIG. 4 is a graph showing the time constant per unit length in terms of the wiring interval, the wiring width and the wiring length.

The signal wiring WR0 extends more than 10 millimeters, and the signal wiring WR5 extends about 6 millimeters. The signal wiring WR0 provides the longest propagation path of all the signal wirings WR0 to WR5, and the propagation path for the address bit is gradually decreased from the signal wiring WR0 to the signal wiring WR5. For this reason, the signal wirings WR0 to WR2 are 1.6 microns in width W, and the signal wirings WR3 to WR5 are 1.2 microns in width. The distance between the adjacent two signal wirings WR0/WR1, WR1/WR2, WR2/WR3, WR3/WR4 and WR4/WR5 is decreased from 2.8 microns through 2.2 microns, 1.6 microns and 1.4 microns to 1.2 microns. The distance between the signal wirings WR0 and WR1 is matched with a substantially saturated point on the uppermost broken line in FIG. 4, and compromises on the two requirements, i.e., the minimum delay and the minimum occupation area. As a result, the signal wiring WR0 decreases the time constant CR at about 10 per cent rather than the signal wiring WR0 of the prior art semiconductor integrated circuit device without sacrifice of the occupation area. Since the delay time of the address bit A0 dominates the activation of the address buffer circuits IN0 to IN5, the address predecoding is accelerated at 10 per cent rather than the prior art device.

Figure 6:
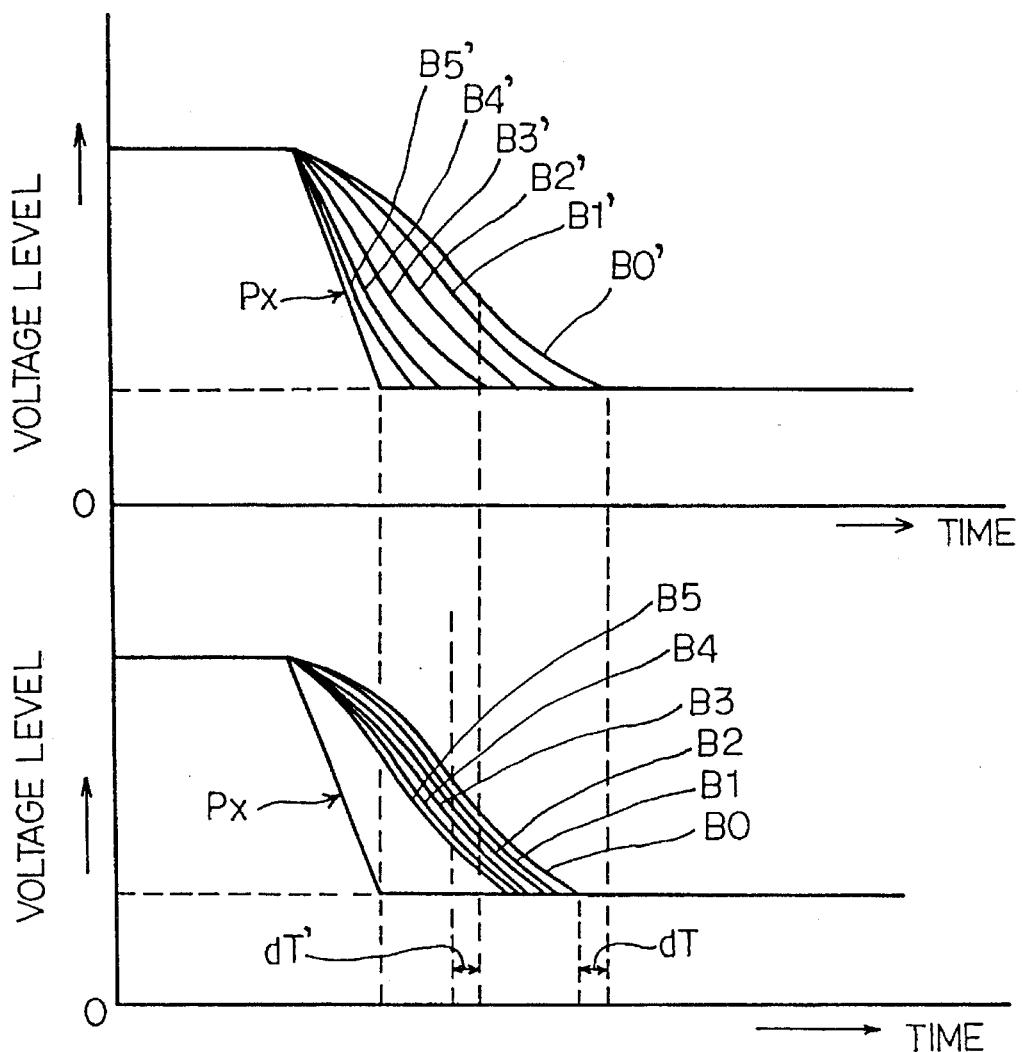
FIG. 6 is a graph showing time delays introduced by respective wirings.

The present inventor confirmed the acceleration of the address bits A0 to A5. In detail, the present inventor measured the time delays from the input signal pads P0 to P5 to the input nodes B0 to B5 of the address buffer circuits IN0 to IN5, and plotted in FIG. 6. When the external row address signal A0 to A5 at the input signal pads P0 to P5 was changed as indicated by Plots Px, the input nodes B0 to B5 of the prior art device traced Plots B0' to B5', and the input nodes B0 to B5 of the semiconductor memory device according to the present invention traced Plots B0 to B5.

The signal wiring WR0 of the present invention shrinks the delay time by dT, and a time delay at the intermediate point on the signal wiring WR0 is decreased by dT".

As will be appreciated from the foregoing description, the signal wiring arrangement according to the present invention changes the wiring width and the wiring interval depending upon the signal path of each signal wiring, and decreases the difference between the longest time delay of the signal and the shortest time delay of the signal without sacrifice of the occupation area of the wiring arrangement.

Second Embodiment

Figure 7:
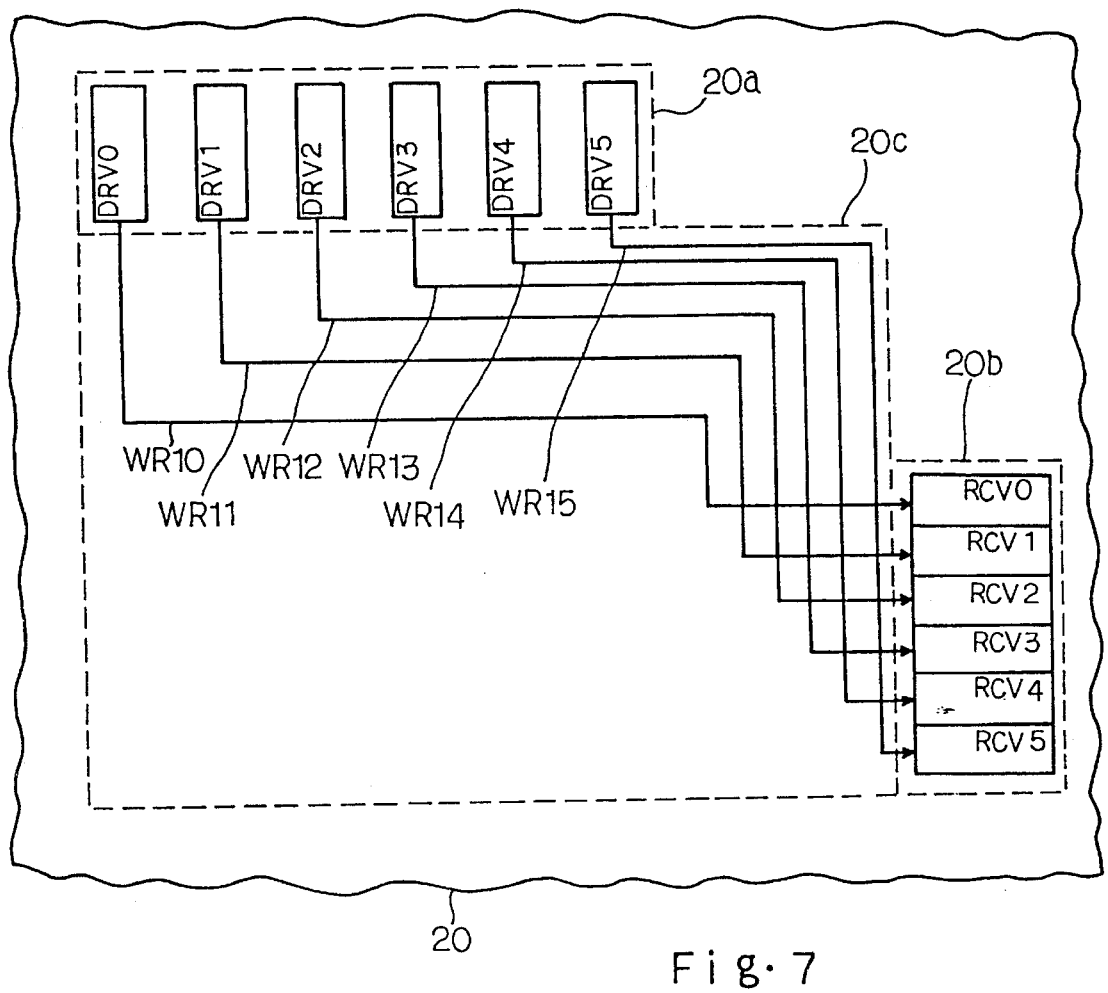
FIG. 7 is a schematic plan view showing another wiring arrangement of a semiconductor integrated circuit device according to the present invention.

Turning to FIG. 7 of the drawings, signal wirings WR10, WR11, WR12, WR13, WR14 and WR15 connect signal drivers DRV0, DRV1, DRV2, DRV3, DRV4 and DRV5 with signal receivers RCV0, RCV1, RCV2, RCV3, RCV4 and RCV5, and the signal wirings WR0 to WR5, the signal drivers DRV0 to DRV5 and the signal receivers RCV0 to RCV5 form parts of a semiconductor integrated circuit device fabricated on a single semiconductor chip 20.

The semiconductor chip 20 has a first area 20a assigned to the signal drivers DRV0 to DRV5, a second area 20b assigned to the signal receivers RCV0 to RCV5 and a third area 20c assigned to the signal wirings WR10 to WR15. In FIG. 7, the lateral length and vertical length are not equally scaled, and the propagation path is decreased from the signal wiring WR10 through the signal wirings WR11, WR12, WR13 and WR14 to the signal wiring WR15.

The wiring width and the wiring interval are decreased from the signal wiring WR10 to the signal wiring WR15, and only a small amount of time delay is introduced into the propagation of a multi-bit driving signal on the signal wirings WR10 to WR15.

Third Embodiment

Figure 8:
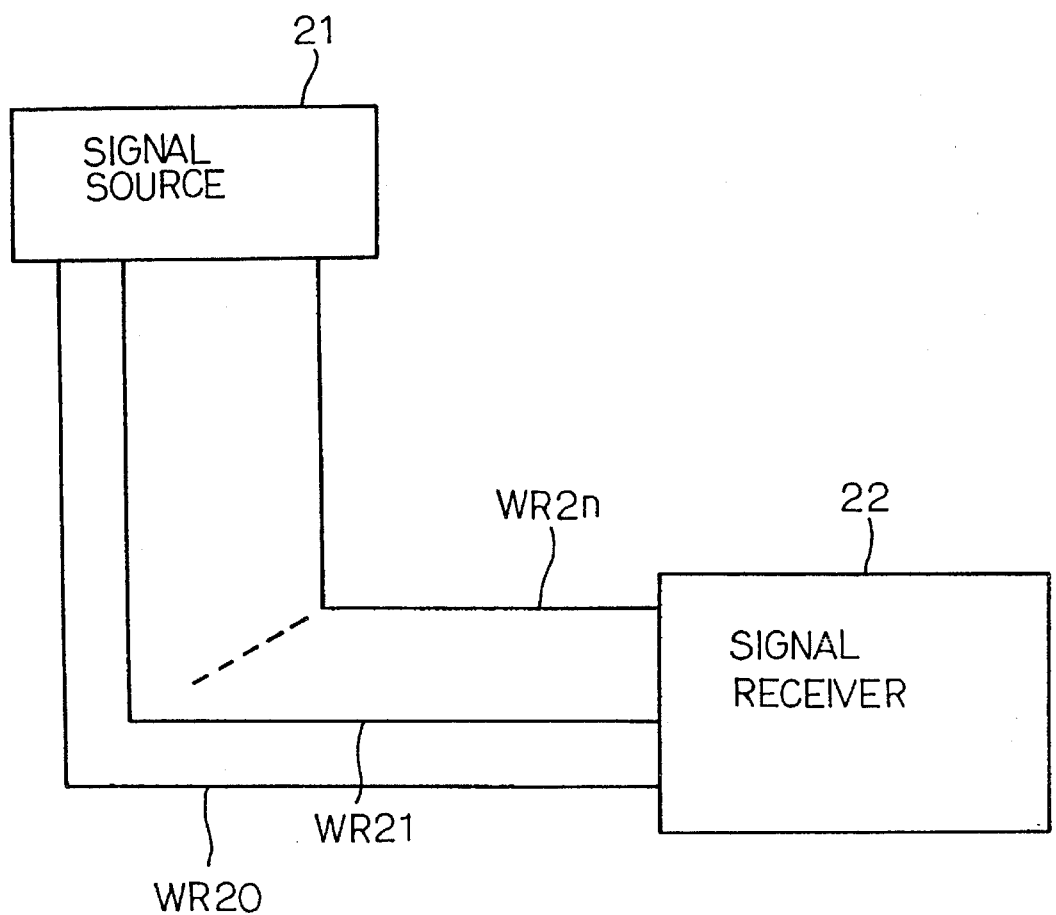
FIG. 8 is a schematic plan view showing yet another wiring arrangement of a semiconductor integrated circuit device.

Turning to FIG. 8 of the drawings, yet another semiconductor integrated circuit device is fabricated on a single semiconductor chip, and has a signal source 21 for producing internal signals, a signal receiver 22 for receiving the internal signals and signal wirings WR20, WR21, . . . and WR2n. The signal wirings WR20 to WR2n provide signal propagation paths different in length, and are, accordingly, different in width.

The wiring arrangement WR20 to WR2n achieves the advantages as similar to the first embodiment.

Fourth Embodiment

Figure 9:
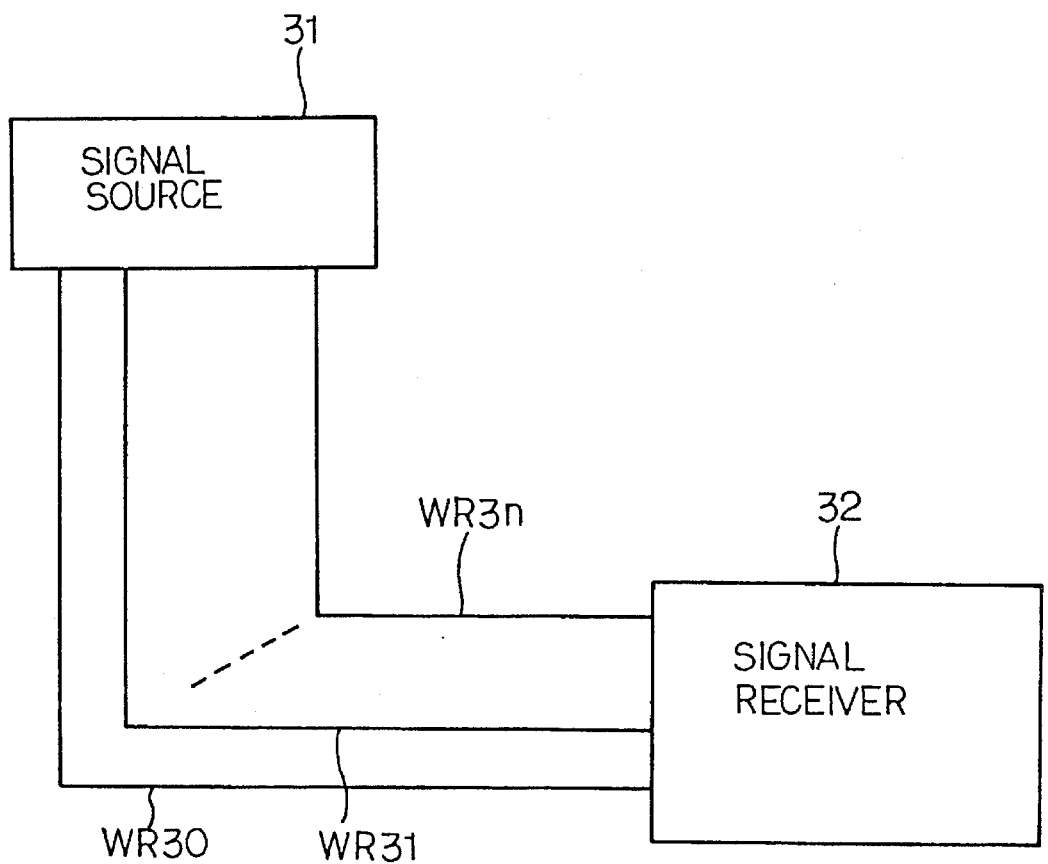
FIG. 9 is a schematic plan view showing still another wiring arrangement of a semiconductor integrated circuit device according to the present invention.

Turning to FIG. 9 of the drawings, still another semiconductor integrated circuit device is fabricated on a single semiconductor chip, and has a signal source 31 for producing internal signals, a signal receiver 32 for receiving the internal signals and signal wirings WR30, WR31, . . . and WR3n. The signal wirings WR30 to WR3n provide signal propagation paths different in length, and are, accordingly, different in wiring interval. The signal source 31 and the signal receiver 32 may be a column address buffer circuit and a column address decoder circuit, and the signal wirings WR30 to WR3n may interconnect the column address buffer circuit and the column address decoder circuit.

The wiring arrangement WR30 to WR3n achieves the advantages as similar to the first embodiment.

As will be appreciated from the foregoing description, the wiring arrangement according to the present invention decreases the time delay between the propagation of the internal signal on the longest path and the propagation of the internal signal on the shortest path without sacrifice of the occupation area.

Although particular embodiments of the present invention have been shown and described, it will be obvious to those skilled in the art that various changes and modifications may be made without departing from the spirit and scope of the present invention. The present invention is applicable to a wiring arrangement for any kind of multi-bit signals, and a wiring arrangement according to the present invention may be incorporated in a semiconductor integrated circuit device different from the semiconductor memory device. In the above description, the column address buffer circuit and the column address decoder circuit are mentioned in regard to the fourth embodiment. However, the wiring arrangements implementing the first to third embodiments are applicable to wirings between a column address buffer circuit and a column address decoder circuit.

What is claimed is:

1. A semiconductor integrated circuit device fabricated on a single semiconductor chip, comprising:

a) a source of a multi-bit signal assigned a first area of said single semiconductor chip;

b) a destination of said multi-bit signal assigned to a second area of said single semiconductor chip; and c) a plurality of signal wirings providing respective propagation paths between said source and said destination for component bits of said multi-bit signal,
wherein said signal wirings include a first signal wiring and a second signal wiring,
wherein said second signal wiring has a length shorter than a length of said first signal wiring,
wherein said first signal wiring has a first width and is disposed a first distance away from a signal wiring adjacent to said first signal wiring,
wherein said second signal wiring has a second width and is disposed a second distance away from a signal wiring adjacent to said second signal wiring, and
wherein said first width is larger than said second width and said first distance is larger then said second distance such that a difference in a time constant due to the difference in length of said propagation paths is decreased.

2. The semiconductor integrated circuit device as set forth in claim 1, in which said source and said destination are an array of input signal pads and an array of input buffer circuits.

3. The semiconductor integrated circuit device as set forth in claim 1, in which said source and said destination are a signal driver unit and a signal receiver unit.

4. The semiconductor integrated circuit device as set forth in claim 1,
wherein a time constant of each signal wiring decreases when said first distance or said second distance increases,
wherein the decrease of said time constant is substantially saturated at a certain value of said first distance and said second distance, and
wherein one of said first distance and said second distance of each signal wiring is determined according to said certain value.

5. A semiconductor memory device fabricated on a single semiconductor chip, comprising:

a) an array of input signal pads where a multi-bit address signal is supplied from outside of said semiconductor memory device;

b) an array of address buffer circuits for receiving said multi-bit address signal; and c) a plurality of signal wirings respectively connected between said input signal pads and said address buffer circuits to respectively provide propagation paths for component bits of said multi-bit address signal,
wherein said plurality of said signal wirings are different in length,
wherein the distance between each signal wiring and an adjacent signal wiring corresponds to the length of said each signal wiring and said adjacent signal wiring,
wherein said plurality of signal wirings comprises at least a first group of signal wirings including a longest signal wiring and a second group of signal wirings including a shortest signal wiring,
wherein all signal wirings of said first group of signal wirings have a first wiring width and all signal wirings of said second group of signal wirings have a second wiring width, and wherein said second wiring width is smaller than said first wiring width.

6. The semiconductor memory device as set forth in claim 5, wherein the length of each of said plurality of signal wirings decreases from said longest signal wiring to said shortest signal wiring and wherein the distance between said each signal wiring and said adjacent signal wiring decreases from said longest signal wiring to said shortest signal wiring.

* * * * *